(12) United States Patent
Tanikawa et al.

(10) Patent No.: US 8,547,751 B2
(45) Date of Patent: Oct. 1, 2013

(54) NON-VOLATILE STORAGE DEVICE

(75) Inventors: Hiroyuki Tanikawa, Tokyo (JP); Bunsho Kuramori, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/327,930

(22) Filed: Dec. 16, 2011

(65) Prior Publication Data
US 2012/0163075 A1 Jun. 28, 2012

(30) Foreign Application Priority Data
Dec. 22, 2010 (JP) ................................. 2010-285916

(51) Int. Cl.
*G11C 11/4193* (2006.01)
*G11C 11/4197* (2006.01)

(52) U.S. Cl.
USPC .............. 365/185.21; 365/185.2; 365/189.09; 365/206; 365/210.12; 365/203

(58) Field of Classification Search
USPC ................... 365/185.2, 185.21, 189.09, 206, 365/210.12, 203
See application file for complete search history.

(56) References Cited

U.S. PATENT DOCUMENTS
6,285,576 B1 * 9/2001 Kang ........................... 365/145

FOREIGN PATENT DOCUMENTS
JP 2007-149296 A 6/2007

* cited by examiner

*Primary Examiner* — Huan Hoang
*Assistant Examiner* — Jay Radke
(74) *Attorney, Agent, or Firm* — Rabin & Berdo, P.C.

(57) ABSTRACT

There is provided a non-volatile storage device including: a bit line that is connected to a non-volatile storage element and is applied with a voltage of magnitude corresponding to the logic value stored in the storage element; a charging section that charges the bit line to a voltage of equivalent magnitude to the reference voltage; a voltage generation section that is connected between the reference voltage line and the bit line, comprises a capacitance load for generating coupling charge when charging by the charging section has been performed, and employs the capacitance load to generate a voltage according to a difference between the magnitude of the voltage of the reference voltage line and the magnitude of the voltage of the bit line as a voltage expressing the comparison result; and a charge absorbing section for absorbing the coupling charge generated by the capacitance load.

6 Claims, 8 Drawing Sheets

US 8,547,751 B2

NON-VOLATILE STORAGE DEVICE

CROSS-REFERENCE TO RELATED APPLICATION

This application is based on and claims priority under 35 USC 119 from Japanese Patent Application No. 2010-285916 filed on Dec. 22, 2010, the disclosure of which is incorporated by reference herein.

BACKGROUND

1. Technical Field

The present invention relates to an electrically writable non-volatile storage device.

2. Related Art

A known related non-volatile memory is one in which, for example, plural memory cells are disposed at word lines WL and bit lines BL so as to form a memory array. Data is read out therefrom by sequentially connecting a read-out amplifier through a selection circuit to the bit line BL of the memory cell to be read out, and using the read-out amplifier to compare the magnitude of the voltage of the bit line connected to the memory cell against the magnitude of a reference voltage.

The memory cells are stored with data representing logic values of "1" or "0". The magnitude of the voltage of the bit line BL changes according to the data stored in the memory cell to be read out, however when, for example, reading out a "0" after previously reading out a "1", it takes time to charge the bit line BL until a stable state is achieved capable of determining a 0-read. This is one cause of access delay.

There is technology described in Japanese Patent Application Laid-Open (JP-A) No. 2007-149296 to address this issue, in which pre-charging is performed to an internal voltage CSV generated by an internal power source when reading out data from the bit line BL, thereby speeding up data reading.

However, the magnitude of the internal voltage CSV does not always match the magnitude of a reference voltage. Accordingly, when the magnitude of the internal voltage CSV is greater than the magnitude of the reference voltage, overshoot occurs due to charging the bit line BL with pre-charging in excess of the magnitude of the reference voltage. In contrast, when the magnitude of the internal voltage CSV is less than the magnitude of the reference voltage, while the access period can be shorted by the pre-charging, time is still required for charging the bit line BL after pre-charging until a stable state can be achieved. An issue thus arises with such a related non-volatile memory in that sometimes an access delay arises due to the magnitude of the internal voltage CSV and the magnitude of the reference voltage not always matching. Note that "charging" in the present specification, in addition to the meaning of accumulating charge in a capacitance element is also employed with a wider meaning to applying a voltage to a wiring line. This definition is adopted in consideration of the parasitic capacitance that exists in wiring lines, and to accumulating charge in this parasitic capacitance.

SUMMARY

In consideration of the above circumstances the present invention is directed towards provision of a non-volatile storage device capable of suppressing access delay from occurring.

An aspect of the present invention provides a non-volatile storage device including:

a bit line that is connected to a non-volatile storage element for storing an electrically re-writable logic value, and is applied with a voltage of magnitude corresponding to the logic value stored in the storage element;

a charging section that, when discriminating the logic value by performing a comparison of the magnitude of the voltage applied to the bit line to the magnitude of a reference voltage applied to a reference voltage line, charges the bit line to a voltage of equivalent magnitude to the reference voltage prior to performing the comparison;

a voltage generation section that is connected between the reference voltage line and the bit line, comprises a capacitance load for generating coupling charge when charging by the charging section has been performed, and employs the capacitance load to generate a voltage according to a difference between the magnitude of the voltage of the reference voltage line and the magnitude of the voltage of the bit line as a voltage expressing the comparison result; and a charge absorbing section for absorbing the coupling charge generated by the capacitance load.

According to the present invention an effect is exhibited in which access delay can be suppressed from occurring.

BRIEF DESCRIPTION OF THE DRAWINGS

Exemplary embodiments of the present invention will be described in detail based on the following figures, wherein.

DETAILED DESCRIPTION

Explanation follows regarding exemplary embodiments of the present invention, with reference to the drawings.

Figure 7:
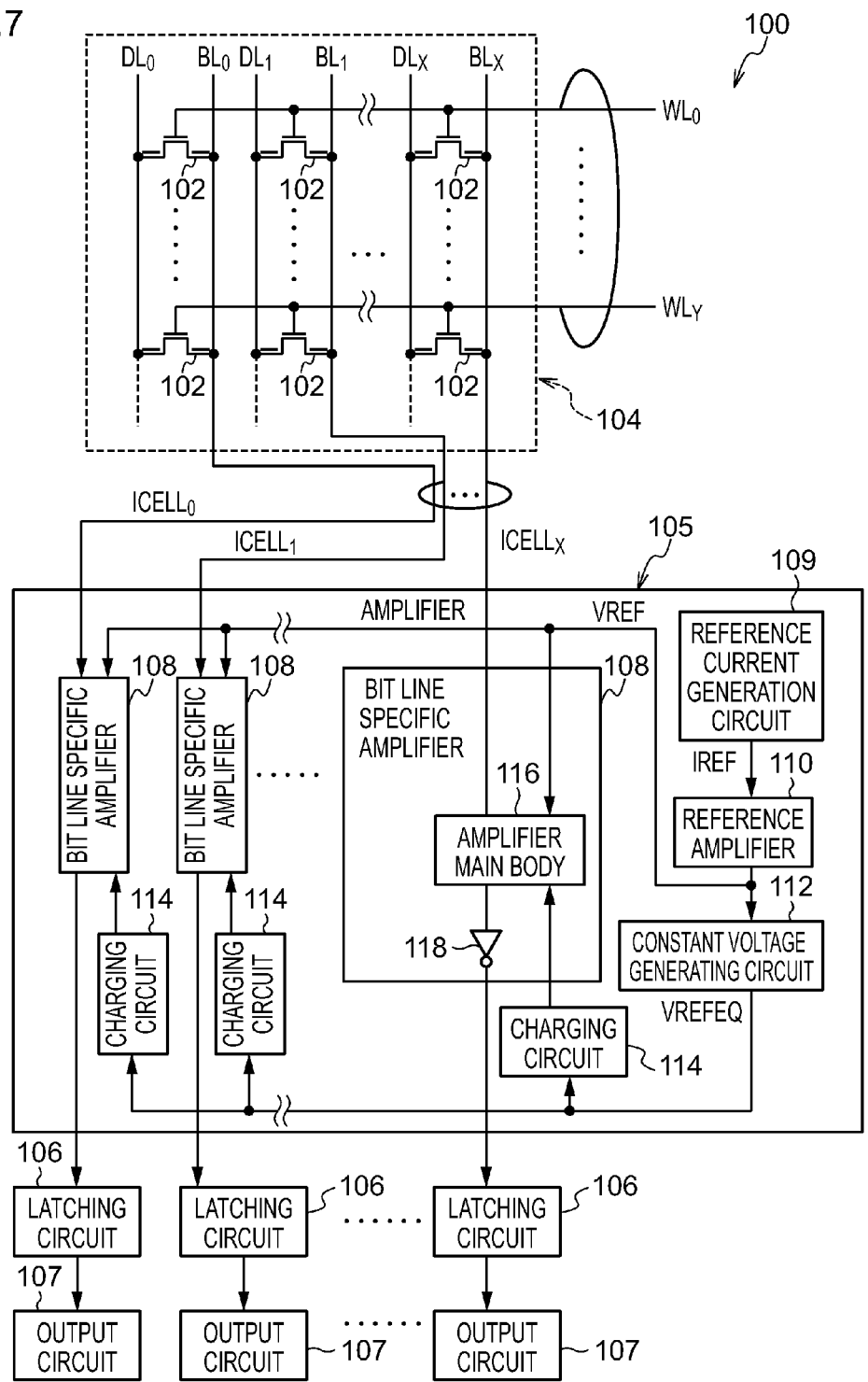
FIG. 7 is a configuration diagram illustrating an example of a basic configuration of a non-volatile memory according to an exemplary embodiment.

Explanation first follows regarding the basic structure of a non-volatile memory. FIG. 7 is a configuration diagram illustrating an example of a basic structure of a non-volatile memory according to the present exemplary embodiment. As shown in FIG. 7, a non-volatile memory 100 is configured including: a memory cell array 104 configured by plural memory cells 102 disposed in a matrix pattern; an amplifier 105 for reading out data from the memory cells 102 and outputting the read data; a latching circuit 106 that holds data that has been output from the amplifier 105; and an output circuit 107 that acquires the data held by the latching circuit 106 and externally outputs the acquired data. Plural word lines WL ($WL_0$, $WL_1$, to $WL_y$) that are decoded by external input of an address are disposed parallel to each other in the memory cell array 104. Plural bit lines BL ($BL_0$, $BL_1$, to $BL_x$) for data transmission are disposed parallel to each other and separated by a specific spacing along a direction intersecting with the plural word lines WL. Plural drain lines DL ($DL_0$, $DL_1$, to $DL_x$) are respectively disposed in the vicinity and parallel to each of the bit lines BL in order to pull down the electrical potential at the drain terminal side of the memory cells 102.

The amplifier 105 is configured including: a bit line specific amplifiers 108 configured by current detection amplifiers provided for each of the bit lines BL; a reference current generating circuit 109 for generating a reference current IREF; a reference amplifier 110 for converting the reference current IREF generated by the reference current generating circuit 109 into a reference voltage VREF; a constant voltage generating circuit 112 for generating a constant voltage VREFEQ of equivalent magnitude to the magnitude of the reference voltage VREF obtained by the reference amplifier 110; and a charging circuit 114 provided for each of the bit line specific amplifiers 108 for charging the bit line BL corresponding to each of the bit line specific amplifiers 108.

Each of the bit line specific amplifiers 108 is configured including: an amplifier main body 116 for generating a voltage corresponding to a difference between the magnitude of a current ICELL ($ICELL_0$, $ICELL_1$, to $ICELL_x$) input from the memory cell 102 through the corresponding bit line BL and the magnitude of the reference current IREF; and a logic circuit 118 that converts the voltage generated by the amplifier main body 116 into a logic value and outputs the logic value.

Figure 8:
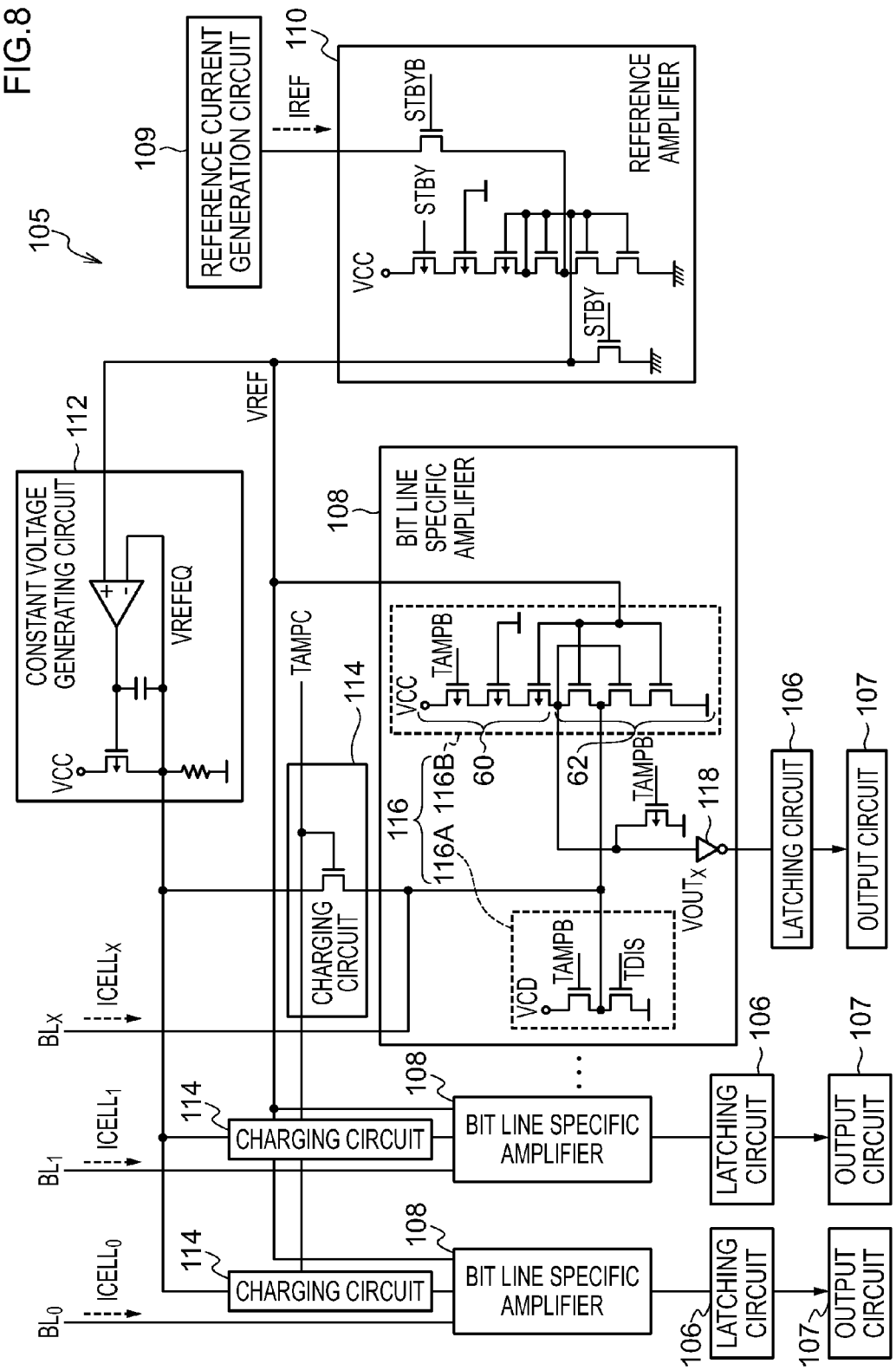
FIG. 8 is a configuration diagram illustrating an example of a basic configuration of an amplifier according to an exemplary embodiment.

FIG. 8 illustrates an example of a basic configuration of the amplifier 105 of the non-volatile memory 100. As shown in FIG. 8, the amplifier main body 116 of each of the bit line specific amplifiers 108 is configured including: an initialization execution circuit 116A for initializing the memory cell 102 to a data readable state by making the electrical potential of the source terminal of the memory cell 102 the ground electrical potential; and a difference voltage output circuit 116B that converts the current flowing in a bit line BL into a voltage, generates a voltage (referred to below as a difference voltage) corresponding to the difference between the magnitude of the converted voltage obtained and the magnitude of the reference voltage VREF obtained by the reference amplifier 110, and outputs the difference voltage to a logic circuit 118. Each of the bit line specific amplifiers 108 is also configured such that the bit line BL is charged to the constant voltage VREFEQ by the respective charging circuit 114.

In order to read data from the memory cells 102 with the thus configured bit line specific amplifiers 108, first the electrical potential of the source terminal of the memory cell 102 is initialized by the initialization execution circuit 116A. Then, after the bit line BL has been charged to the constant voltage VREFEQ with the charging circuit 114, a difference voltage is output from the difference voltage output circuit 116B. The magnitude of the difference voltage output from the difference voltage output circuit 116B is larger than the reference voltage VREF when the magnitude of the current ICELL input from the memory cells 102 through the bit line BL is greater than the magnitude of the reference current IREF, and smaller than the reference voltage VREF when the magnitude of the current ICELL output from the memory cells 102 is smaller than the magnitude of the reference current IREF. Consequently the logic circuit 118 can identify the logic value represented by the data of the memory cells 102 by determining whether or not the magnitude of the difference voltage input from the difference voltage output circuit 116B is greater than the reference voltage VREF.

By charging the bit line BL to the constant voltage VREFEQ in this manner prior to generating the difference voltage, access delay to the memory cells 102 can be better suppressed from occurring than with the technology of JP-A No. 2007-149296.

As shown in FIG. 8, the difference voltage output circuit 116B is configured including: a PMOS serial section 60 configured by plural serially connected P-channel MOS field effect transistors (referred to below as PMOS transistors); and an NMOS serial section 62 configured from plural serially connected N-channel MOS field effect transistors (referred to below as NMOS transistors), wherein the PMOS serial section 60 and the NMOS serial section 62 are connected together in series. In the difference voltage output circuit 116B, as shown in FIG. 8, the gate terminal of one of the PMOS transistors in the PMOS serial section 60 and gate terminals of two of the NMOS transistors of the NMOS serial section 62 are connected to the output terminal of the reference amplifier 110 so as to be applied with the reference voltage VREF through a reference voltage line. The connection point between the PMOS serial section 60 and the NMOS serial section 62 is connected to the input terminal of the logic circuit 118, and the source terminal of the NMOS transistor that is serially connected to the PMOS serial section 60 is connected to the bit line BL. The difference voltage output circuit 116B can accordingly generate a difference voltage capable of identifying the logic value represented by data stored in the memory cell 102 that is the target for data readout, and can output the difference voltage to the logic circuit 118.

However, in the difference voltage output circuit 116B, due to the gate voltage spiking up through the gate capacitance of the PMOS transistors and the NMOS transistors when charging with the charging circuit 114 is initiated, it becomes difficult to maintain the magnitude of the gate voltage at the same magnitude as the reference voltage VREF. The reference amplifier 110 is hence configured as a similar serial circuit to the difference voltage output circuit 116B, namely as shown in FIG. 8, as a serial circuit configured by a PMOS serial section similar to the PMOS serial section 60 and connected in series to an NMOS serial section similar to the NMOS serial section 62. Since the reference voltage VREF is generated by this serial circuit there is limited capability for applying the reference voltage VREF to the difference voltage output circuit 116B. Accordingly, if the gate voltage of the PMOS transistors and the NMOS transistors of the difference voltage output circuit 116B have spiked up then it takes time for the gate voltage to return to the reference voltage VREF, with the possibility that access to the memory cells 102 is delayed by such an amount.

In a first exemplary embodiment and a second exemplary embodiment described below a non-volatile memory is disclosed that is capable of significantly lowering the possibility of access delay arising.

In the following similar parts of the configuration to those of the non-volatile memory 100 illustrated in FIG. 7 and the amplifier 105 illustrated in FIG. 8 are allocated the same reference numerals and further explanation is omitted.

First Exemplary Embodiment

Figure 1:
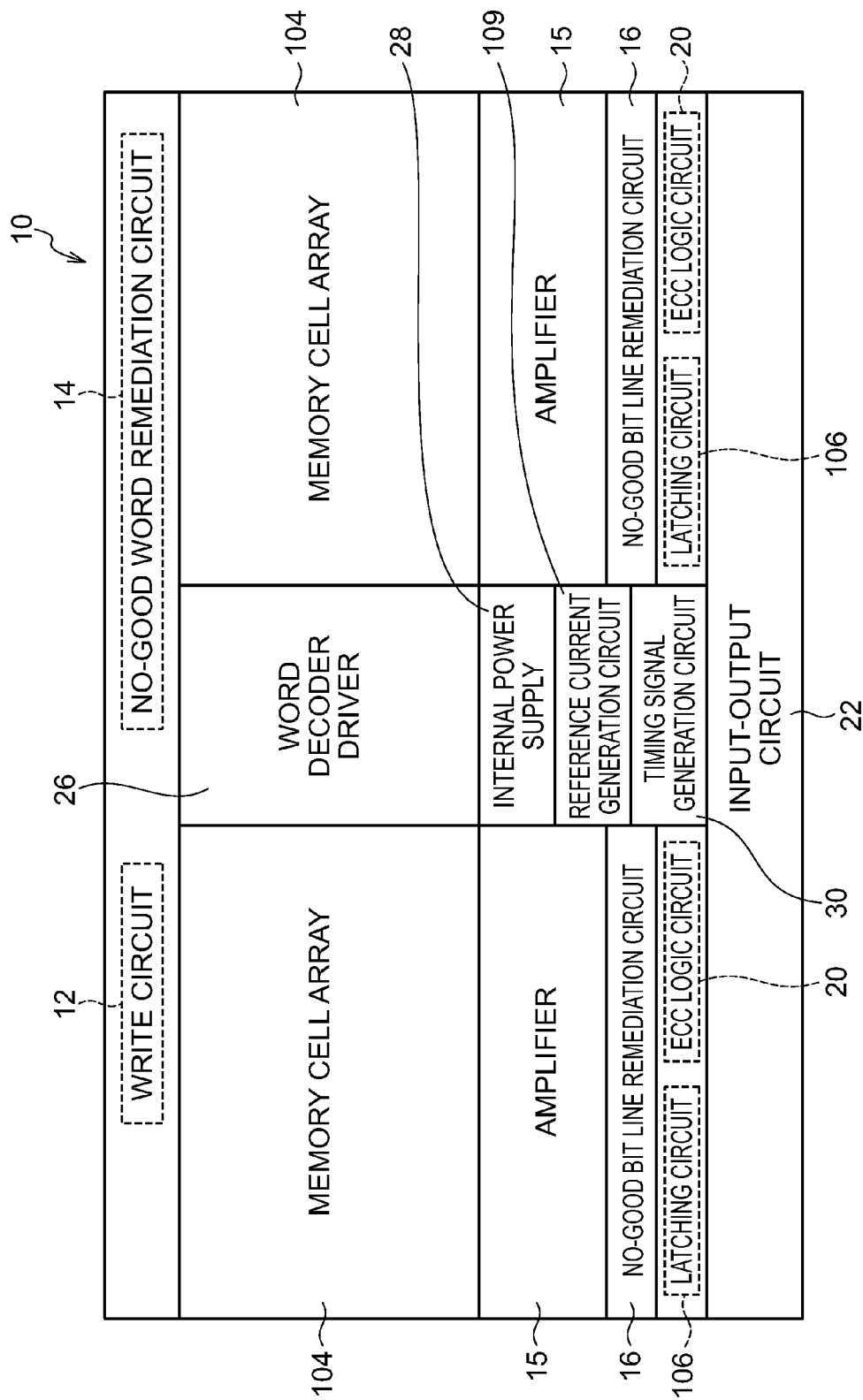
FIG. 1 is a diagram schematically illustrating an example of a schematic configuration of a non-volatile memory according to a first exemplary embodiment.

FIG. 1 schematically illustrates an example of a configuration of a non-volatile memory 10 according to a first exemplary embodiment of the present invention. As shown in FIG. 1, the non-volatile memory 10 is equipped with plural memory cell arrays 104. The plural memory cell arrays 104 are provided with a common write circuit 12 and a common fail word redundancy circuit 14. The write circuit 12 is a circuit for applying a voltage to the memory cells 102 in order to re-write data. The fail word redundancy circuit 14 is a redundancy circuit for performing remediation by employing a reserve word line when a fail word line WL arises.

Each of the memory cell arrays 104 is provided with an amplifier 15, a fail bit line redundancy circuit 16, a latching circuit 106 and an ECC logic circuit 20. Each of the amplifiers 15 is equipped with the functions of the amplifier 105 illustrated in FIG. 8. Each of the fail bit line redundancy circuits 16 is a redundancy circuit for performing remediation by employing a reserve bit line when a fail bit line BL arises. Each of the latching circuits 106 is a circuit for holding the logic value representing data output from the amplifier 15. Each of the ECC logic circuits 20 is a circuit for detecting and correcting an incorrect logic value when an incorrect logic value is output from the amplifier 15 due to a defective memory cell 102.

The plural memory cell arrays 104 are provided with a common input-output circuit 22, and input of address data representing the address to identify the memory cell 102, and output of logic values determined by the amplifier 15, is performed through the input-output circuit 22.

The non-volatile memory 10 is also provided with a word decoder driver 26, an internal power supply 28, a reference current generation circuit 109 and a timing signal generation circuit 30. The word decoder driver 26 applies a voltage for reading out data from the word line WL of the memory cell 102 indicated by the address expressed by the address data input through the input-output circuit 22. The internal power supply 28 transforms an external voltage VCC supplied from an external power source (not shown in the drawings) and feeds the transformed voltage to each of the sections as an internal voltage VCD. The timing signal generation circuit 30 is a circuit for generating a timing signal for designating an operation period for each of the sections configuring the non-volatile memory 10.

Figure 2:
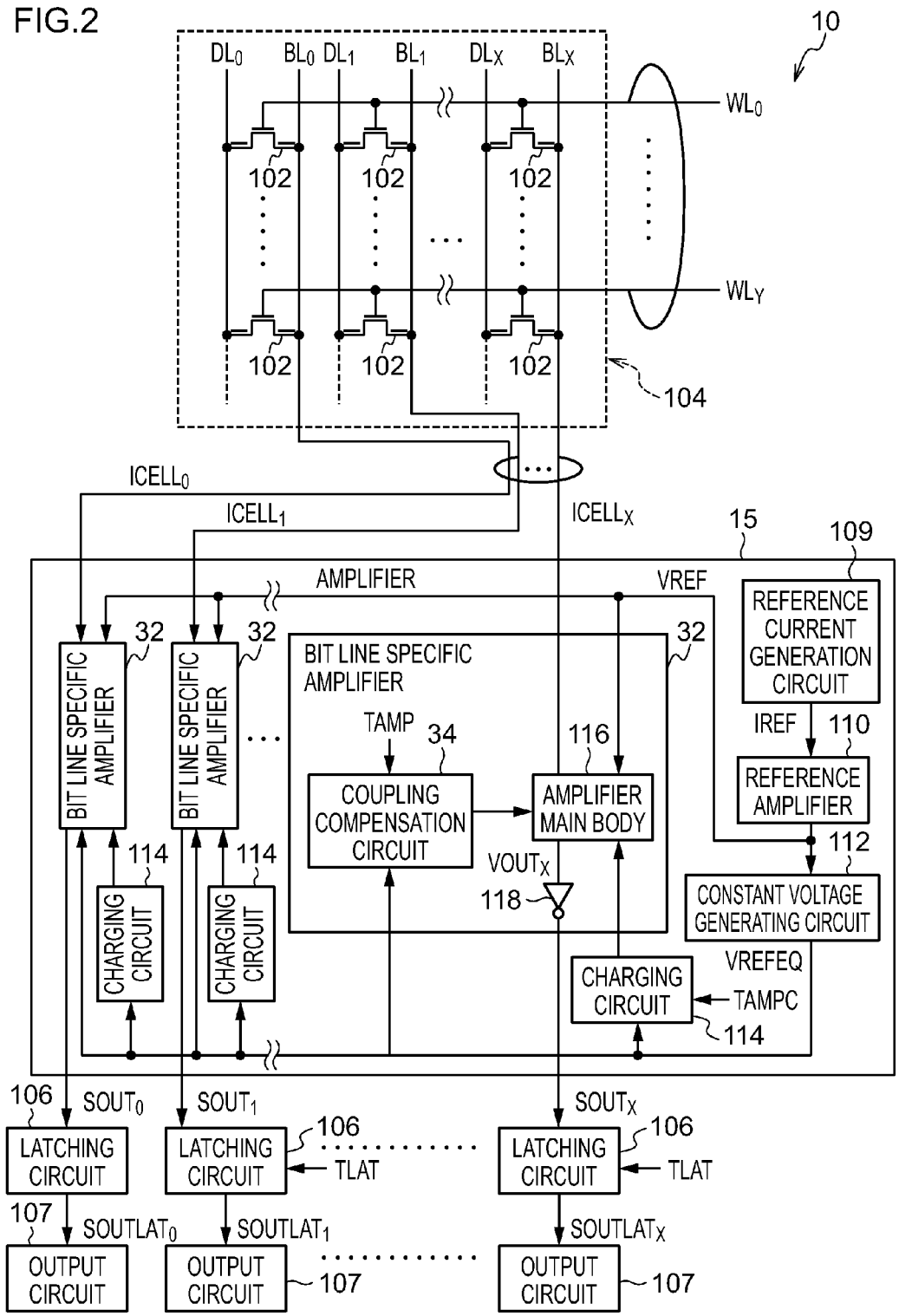
FIG. 2 is a configuration diagram illustrating an example of a schematic configuration of a non-volatile memory according to the first exemplary embodiment.

FIG. 2 is a schematic diagram illustrating an example of a configuration of the non-volatile memory 10 according to the first exemplary embodiment. The non-volatile memory 10 differs from the non-volatile memory 100 illustrated in FIG. 7 in that the amplifier 15 is applied in place of the amplifier 105.

In the memory cell array 104 respective word lines WL are connected to floating gates of each of the memory cells 102, a bit line BL is connected to the source terminal of each of the memory cells 102, and a drain line DL is connected to the drain terminal of each of the memory cells 102.

Each of the bit lines BL is connected to the amplifier 15. The amplifier 15 differs from the amplifier 105 illustrated in FIG. 8 in that a bit line specific amplifier 32 is applied in place of the bit line specific amplifier 108. The bit line specific amplifier 32 differs from the bit line specific amplifier 108 illustrated in FIG. 8 in that a new coupling compensation circuit 34 is provided.

The corresponding bit line BL is connected to the amplifier main body 116 of the bit line specific amplifier 32. The coupling compensation circuit 34 is also connected to the amplifier main body 116. The timing signal generation circuit 30 is also connected to the coupling compensation circuit 34, and an operation period signal TAMP expressing the operation period of the amplifier 15 by high level is input to the coupling compensation circuit 34. In the bit line specific amplifier 32 the input terminal of the logic circuit 118 is connected to the amplifier main body 116, and a difference voltage VOUT is supplied from the amplifier main body 116.

Respective latching circuits 106 and output circuits 107 are provided to each of the bit line specific amplifiers 32. The output circuit 107 is incorporated in the input-output circuit 22 illustrated in FIG. 1. The output terminal of the logic circuit 118 is connected to the input terminal of the corresponding latching circuit 106, and the output terminal of the latching circuit 106 is connected to the input terminal of the corresponding output circuit 107. The timing signal generation circuit 30 is also connected to the latching circuit 106, and a latchable period signal TLAT, expressing a period during which it is possible to hold (latch) input data as high level, is input to the latching circuit 106. The period during which it is possible for the latching circuit 106 to hold data is referred to below as the latchable period.

Consequently, each of the amplifier main bodies 116 outputs a difference voltage VOUT ($VOUT_0$, $VOUT_1$, to $VOUT_X$), the logic circuit 118 converts the difference voltage VOUT supplied from the amplifier main body 116 into a logic value and outputs a logic value SOUT ($SOUT_0$, $SOUT_1$, to $SOUT_X$). The latching circuit 106 holds the logic value SOUT input from the logic circuit 118 according to the latchable period signal TLAT input from the timing signal generation circuit 30. The logic values SOUT held by the latching circuits 106 are subjected to error correction by the ECC logic circuit 20 as required, and output to the output circuits 107 as logic values SOUTLAT ($SOUTLAT_0$, $SOUTLAT_1$, to $SOUTLAT_X$).

The output terminal of the reference current generation circuit 109 is connected to the input terminal of the reference amplifier 110. The output terminal of the reference amplifier 110 is connected both to the input terminal of the constant voltage generating circuit 112 and to the amplifier main body 116 of each of the bit line specific amplifiers 32. The output terminal of the constant voltage generating circuit 112 is connected to both the input terminal of each of the charging circuits 114 and the input terminal of the coupling compensation circuit 34 of each of the bit line specific amplifiers 32. The timing signal generation circuit 30 is also connected to each of the charging circuits 114, and a charging period signal TAMPC, expressing a charging period for performing charging as high level, is input to the charging circuits 114. In the first exemplary embodiment the charging period is set at 30 ns. However the charging period here is estimated and set as a period to achieve a stable electrical potential of the bit lines BL, by setting as a period from starting charging to when the magnitude of the voltage of the word line WL of the memory cell 102 has reached the magnitude of the voltage capable of reading out the data stored in the memory cell 102 to which an additional margin of a few ns is added.

Figure 3:
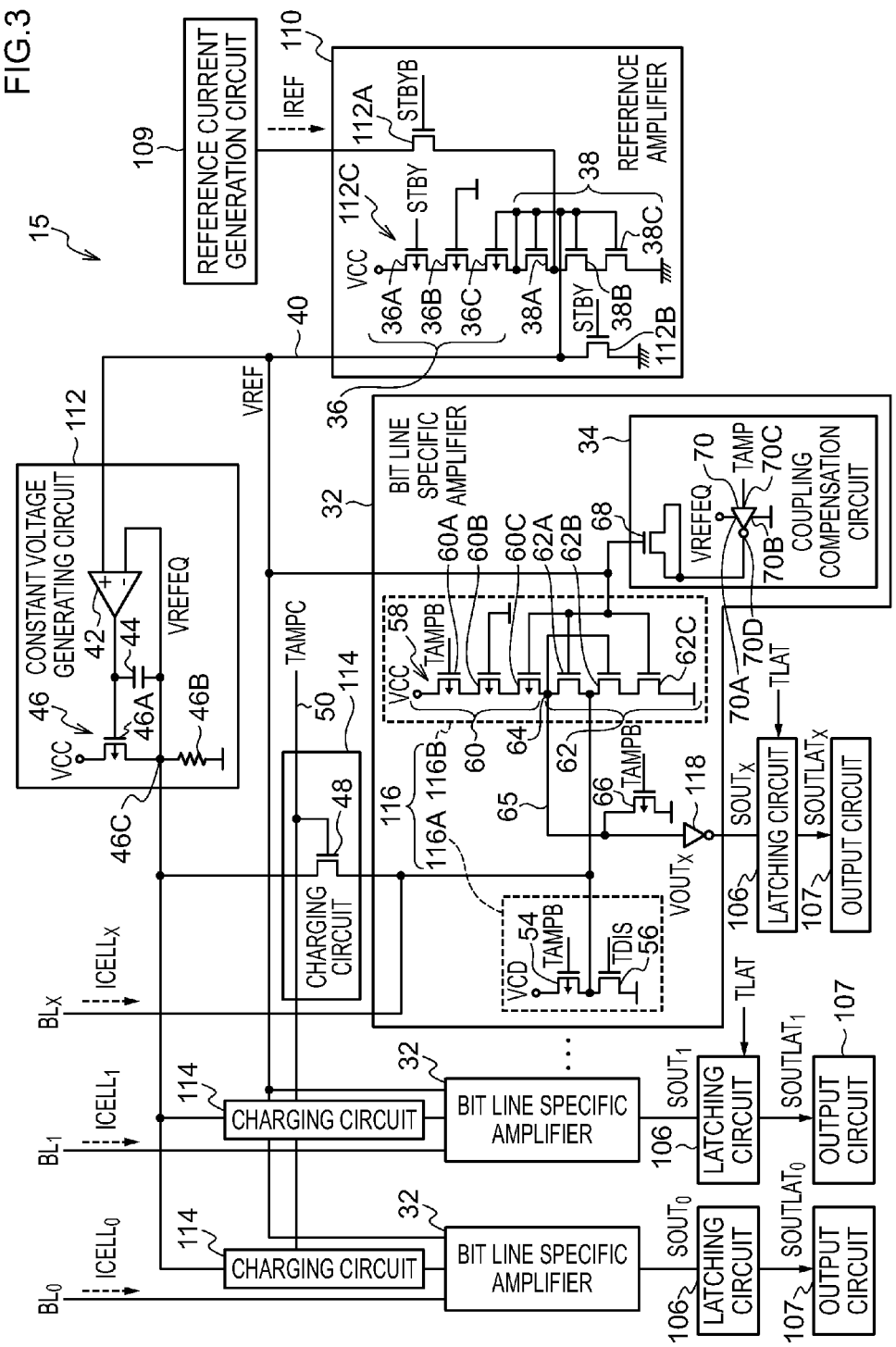
FIG. 3 is a configuration diagram illustrating an example of relevant portions configuring an amplifier according to the first exemplary embodiment.

FIG. 3 illustrates an example of a configuration of the amplifier 15 according to the first exemplary embodiment. As shown in FIG. 3, the reference amplifier 110 is configured including NMOS transistors 112A, 112B with respective gate terminals that are connected to the timing signal generation circuit 30, and a serial circuit 112C.

The serial circuit 112C is configured including a PMOS serial section 36 configured with PMOS transistors 36A, 36B, 36C connected in series, and an NMOS serial section 38 configured with NMOS transistors 38A, 38B, 38C connected together in series. An external voltage line applied with the external voltage VCC is connected to the source terminal of the PMOS transistor 36A at one end of the PMOS serial section 36, and the drain terminal of the NMOS transistor 38A at one end of the NMOS serial section 38 is connected to the drain terminal of the PMOS transistor 36C at the other end of the PMOS serial section 36. The source terminal of the NMOS transistor 38C at the other end of the NMOS serial section 38 is grounded.

The gate terminal of the PMOS transistor 36B is grounded. The respective gate terminals of the PMOS transistor 36A and the NMOS transistors 112A, 112B are connected to the timing signal generation circuit 30. Whereas the respective gate terminals of the PMOS transistor 36A and the NMOS transistor 112B are input with the same level signal as each other by the timing signal generation circuit 30, the gate terminal of the NMOS transistor 112A is input by the timing signal generation circuit 30 with an inverted signal of this signal.

The signal input from the timing signal generation circuit 30 to the respective gate terminals of the PMOS transistor 36A and the NMOS transistors 112A, 112B is different during a non-operational period during which data cannot be read from the memory cell 102 by the amplifier 15 from that in an operation period during which data can be read from the memory cell 102 by the amplifier 15. Namely, during the operation period a signal STBY at low level (a signal level such that in a PMOS transistor there is a conducting state between the source terminal and the drain terminal during the period when input to the gate terminal, and in an NMOS transistor there is a non-conducting state between the source terminal and the drain terminal during the period when input to the gate terminal) is input to the gate terminals of the PMOS transistor 36A and the NMOS transistor 112B. Similarly during the operation period a signal STBYB at high level (a signal level such that there is a non-conducting state between the source terminal and the drain terminal during the period when input to the gate terminal of a PMOS transistor, and there is a conducting state between the source terminal and the drain terminal during the period when input to the gate terminal of an NMOS transistor) is input to the gate terminals of the NMOS transistor 112A. In contrast, in the non-operational period signal STBY is input at high level to the respective gate terminals of the PMOS transistor 36A and the NMOS transistor 112B, and the signal STBYB is input at low level to the gate terminal of the NMOS transistor 112A.

The drain terminal of the NMOS transistor 112A is connected through the input terminal of the reference amplifier 110 to the output terminal of the reference current generation circuit 109. The source terminal of the NMOS transistor 112A is connected to the connection point between the source terminal of the NMOS transistor 38A of the NMOS serial section 38 and the drain terminal of the NMOS transistor 38B.

The gate terminals of the NMOS transistors 38A, 38B, 38C and the gate terminal of the PMOS transistor 36C are mutually connected together, and also connected to a connection point of the drain terminal of the PMOS transistor 36C and the drain terminal of the NMOS transistor 38A.

The source terminal of the NMOS transistor 112B is grounded. The drain terminal of the NMOS transistor 112B is connected to the respective gate terminals of the NMOS transistors 38A, 38B, 38C and the gate terminal of the PMOS transistor 36C. A reference voltage line 40 is also connected to the drain terminal of the NMOS transistor 112B. The reference amplifier 110 is accordingly capable of converting the reference current IREF input from the reference current generation circuit 109 into the reference voltage VREF and outputting reference voltage VREF through the reference voltage line 40.

The constant voltage generating circuit 112 is configured including an operational amplifier 42, a condenser 44 and a voltage-dividing circuit 46. The voltage-dividing circuit 46 is configured with a PMOS transistor 46A and a resistor 46B connected together in series. An external voltage line applied with the external voltage VCC is connected to the source terminal of the PMOS transistor 46A, and one end of the resistor 46B is connected to the drain terminal of the PMOS transistor 46A, with the other end of the resistor 46B grounded. The reference voltage line 40 is connected to the non-inverting input terminal of the operational amplifier 42, and the inverting input terminal of the operational amplifier 42 is connected to the connection point 46C between the PMOS transistor 46A and the resistor 46B and also to one end of the condenser 44. The gate terminal of the PMOS transistor 46A and the other end of the condenser 44 are connected to the output terminal of the operational amplifier 42. Accordingly the constant voltage generating circuit 112 is capable of generating at the connection point 46C a constant voltage VREFEQ of magnitude equivalent to the reference voltage VREF supplied from the reference amplifier 110 through the reference voltage line 40.

Each of the charging circuits 114 is configured including an NMOS transistor 48. The drain terminal of the NMOS transistor 48 is connected to the connection point 46C of the constant voltage generating circuit 112, and the source terminal of the NMOS transistor 48 is connected to the corresponding bit line BL. The gate terminal of the NMOS transistor 48 is connected to the timing signal generation circuit 30 through a transmission line 50. Accordingly, during the period of time in which the signal level of the charging period signal TAMPC transmitted by the transmission line 50 is high level, the corresponding bit line BL is charged to the constant voltage VREFEQ due to the conducting state between the source terminal and the drain terminal of the NMOS transistor 48. However during the period of time in which the signal level of the charging period signal TAMPC transmitted by the transmission line 50 is low level, the corresponding bit line BL is not charged due to the non-conducting state between the source terminal and the drain terminal of the NMOS transistor 48.

The initialization execution circuit 116A is configured with a PMOS transistor 54 and an NMOS transistor 56 connected together in series. The source terminal of the PMOS transistor 54 is connected to the internal power supply 28 (see FIG. 1), and applied with an internal voltage VCD. The drain terminal of the PMOS transistor 54 is connected to the drain terminal of the NMOS transistor 56, and the source terminal of the NMOS transistor 56 is grounded. The connection point between the PMOS transistor 54 and the NMOS transistor 56 is connected to the bit line BL. The timing signal generation circuit 30 is also connected to the gate terminal of the PMOS transistor 54 such that an inverted operation period signal TAMPB is input from the timing signal generation circuit 30. The inverted operation period signal TAMPB is the inverted signal of the operation period signal TAMP that expresses the operation period of the amplifier 15 at high level.

The timing signal generation circuit 30 is also connected to the gate terminal of the NMOS transistor 56 such that a discharge period signal TDIS, expressing high level during a period of time for discharging the bit line BL occurring at an initial period in the operation period of the amplifier 15, is input from the timing signal generation circuit 30.

The difference voltage output circuit 116B is configured including a serial circuit 58. The serial circuit 58 is configured including a PMOS serial section 60 configured by PMOS transistors 60A, 60B, 60C connected together in series, and an NMOS serial section 62 configured by NMOS transistors 62A, 62B, 62C connected together in series, wherein the PMOS serial section 60 and the NMOS serial section 62. The connection point between the NMOS transistor 62A and the NMOS transistor 62B is connected to the bit line BL. Namely, the connection point between the NMOS transistor 62A and the NMOS transistor 62B is connected through the bit line BL to both the connection point between the PMOS transistor 54 and the NMOS transistor 56 and the source terminal of the NMOS transistor 48.

The source terminal of the PMOS transistor 60A that is at one end of the PMOS serial section 60 is connected to an external voltage line applied with the external voltage VCC, and the drain terminal of the PMOS transistor 60C situated at other end of the PMOS serial section 60 is connected to the drain terminal of the NMOS transistor 62A situated at the other end of the NMOS serial section 62. The source terminal of the NMOS transistor 62C that is at the other end of the NMOS serial section 62 is grounded.

In the serial circuit 58, the timing signal generation circuit 30 is connected to the gate terminal of the PMOS transistor 60A of the PMOS serial section 60 so as to be input with the inverted operation period signal TAMPB from the timing signal generation circuit 30. The gate terminal of the PMOS transistor 60B of the PMOS serial section 60 is grounded. The gate terminals of the PMOS transistor 60C and the NMOS transistors 62A, 62C are mutually connected together, and are also connected to the reference voltage line 40. The gate terminal of the NMOS transistor 62B is connected to the connection point 64 between the PMOS serial section 60 and the NMOS serial section 62 (the connection point between the drain terminal of the PMOS transistor 60C and the drain terminal of the NMOS transistor 62A). The connection point 64 is also connected to the input terminal of the logic circuit 118 through a wiring line 65 applied with a difference voltage.

The bit line specific amplifier 32 is configured including a PMOS transistor 66. The source terminal of the PMOS transistor 66 is connected to the input terminal of the logic circuit 118. The drain terminal of the PMOS transistor 66 is grounded. The timing signal generation circuit 30 is also connected to the gate terminal of the PMOS transistor 66 so as to be input with the inverted operation period signal TAMPB from the timing signal generation circuit 30.

The coupling compensation circuit 34 is a circuit for compensating for charge (referred to below as coupling charge) generated by capacitance coupling of the PMOS transistor 60C and the NMOS transistors 62A, 62C in the serial circuit 58 when charging with the charging circuit 114 is initiated.

The coupling compensation circuit 34 is configured including an NMOS transistor 68 and an inverting circuit 70. The gate terminal of the NMOS transistor 68 is connected to the gate terminals of the PMOS transistor 60C and the NMOS transistors 62A, 62C. The inverting circuit 70 includes a first power source terminal 70A, a second power source terminal 70B, an input terminal 70C and an output terminal 70D. The connection point 46C of the constant voltage generating circuit 112 is connected to the first power source terminal 70A and applied with the constant voltage VREFEQ. The second power source terminal 70B is grounded. The timing signal generation circuit 30 is connected to the input terminal 70C such that the operation period signal TAMP is input from the timing signal generation circuit 30. The source terminal and the drain terminal of the NMOS transistor 68 are connected to the output terminal 70D. The NMOS transistor 68 is configured such that charge is generated at the gate terminal of the same amount but opposite polarity to the coupling charge generated at the gate terminals of the PMOS transistor 60C and the NMOS transistors 62A, 62C when charging with the charging circuit 114 is initiated.

Figure 4:
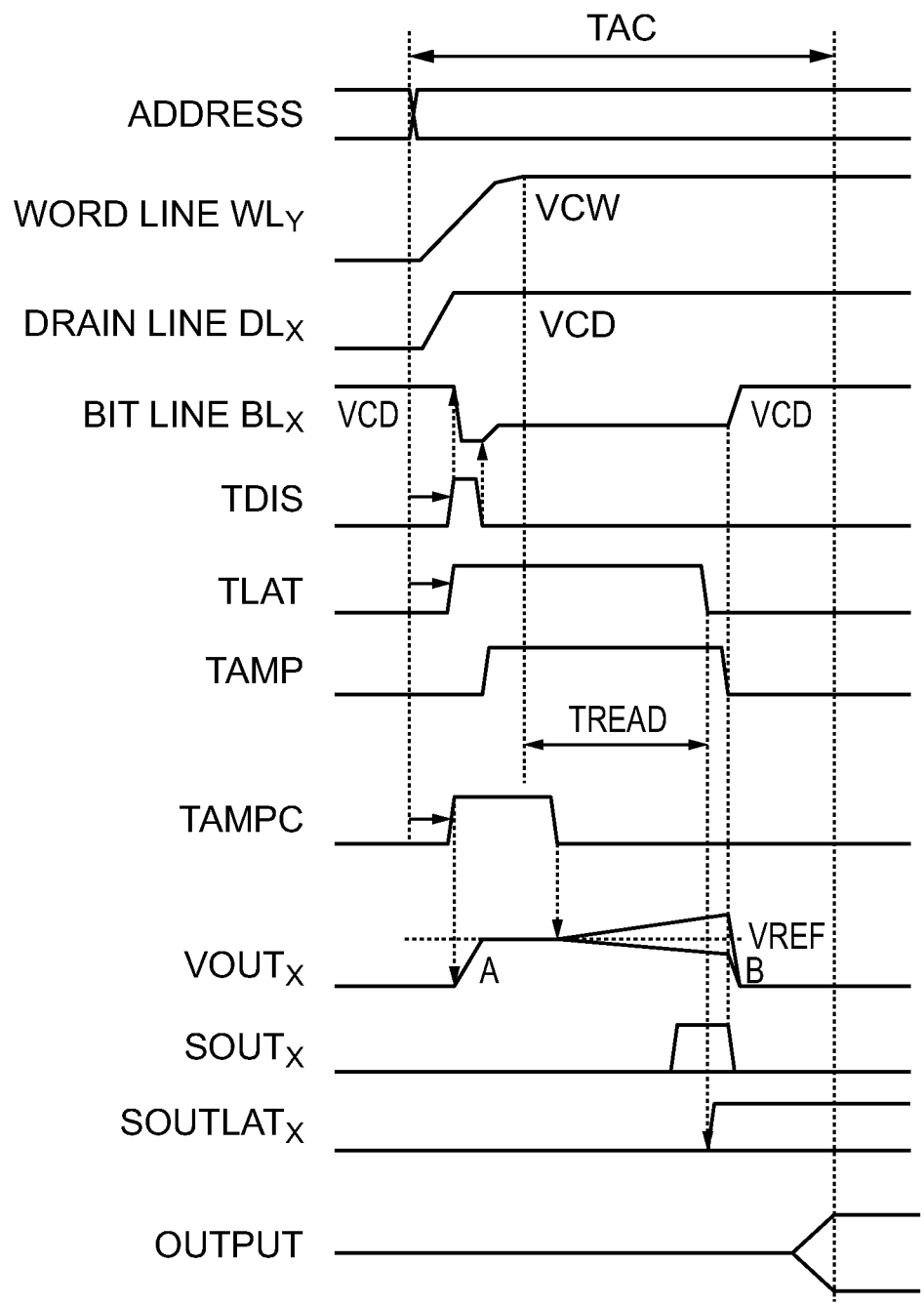
FIG. 4 is a timing chart illustrating an example of signal transition states in a non-volatile memory according to the first exemplary embodiment.

Explanation follows regarding operation of the non-volatile memory 10 according to the first exemplary embodiment of the present invention, with reference to FIG. 4. FIG. 4 is a timing chart illustrating transitions in signal levels in the amplifier 15 when data is being read from the memory cell 102. In order to avoid confusion, explanation is given here of a case in which data is read from a memory cell 102 connected to the word line $WL_y$, the drain line $DL_x$ and the bit line $BL_x$. The bit line $BL_x$ is also applied in this example with the internal voltage VCD during periods of time other than the operation period of the amplifier 15.

As shown in FIG. 4, in the amplifier 15, when new address data is input from outside and the address is refreshed, access to the memory cell 102 at the new address is initiated. TAC in FIG. 4 indicates the access period to the memory cell 102.

When access to the memory cell 102 is initiated, a voltage VCW enabling reading of data stored in the memory cell 102 is applied to the word line $WL_y$ of the memory cell 102 and the internal voltage VCD is applied to the drain line $DL_x$ of the memory cell 102.

When access has been initiated to the memory cell 102, the latchable period signal TLAT, the discharge period signal TDIS and the charging period signal TAMPC all transition at the same time from low level to high level. When the discharge period signal TDIS has transitioned from low level to high level, the non-conducting state between the source terminal and the drain terminal of the NMOS transistor 56 transitions to a conducting state. The internal voltage VCD being applied to the bit line $BL_x$ is accordingly discharged during a period of time (for example 5 ns) in which the charge period signal TDIS is high level, resulting in the magnitude of the voltage of the bit line $BL_x$ falling to voltage VSS (for example ground voltage level). The latching circuit 106 enters a latchable state when the latchable period signal TLAT has transitioned from low level to high level. When the charging period signal TAMPC has transitioned from low level to high level, the constant voltage VREFEQ is applied to the bit line $BL_x$ during the high level period (for example 30 ns) of the charging period signal TAMPC and the wiring line 65 is charged to the constant voltage VREFEQ (the difference voltage $VOUT_X$ output from the difference voltage output circuit 116B rises to the constant voltage VREFEQ).

When the discharge period signal TDIS has transitioned back from high level to low level, the operation period signal TAMP transitions from low level to high level, and current corresponding to data of the memory cell 102 starts flowing in the bit line $BL_x$ in response to this transition. This current flows for the duration the operation period signal TAMP is at high level. When the latchable period signal TLAT has transitioned from high level to low level the operation period signal TAMP transitions back from high level to low level, and accordingly current is no longer able to flow in the bit line $BL_x$.

Charging ends when the charging period signal TAMPC has transitioned from high level to low level, and the difference voltage output circuit 116B generates a difference voltage corresponding to the difference between the magnitude of the current $ICELL_X$ flowing in the bit line BL at this point in time, and the magnitude of the reference current IREF. This difference voltage is output to the wiring line 65 that has been charged to the constant voltage VREFEQ. The magnitude of the difference voltage $VOUT_X$ is greater than the reference voltage VREF when the magnitude of the current $ICELL_X$ is greater than the magnitude of the reference current IREF. However, the magnitude of the difference voltage $VOUT_X$ is less than the reference voltage VREF when the magnitude of the current $ICELL_X$ is less than the magnitude of the reference current IREF.

The logic circuit 118 converts the difference voltage supplied from the difference voltage output circuit 116B into a logic value, and outputs the converted logic value obtained, logic value SOUT$_X$, to the latching circuit 106. The latching circuit 106 holds the logic value SOUT$_X$ input from the logic circuit 118, and outputs the logic value SOUT$_X$ as the logic value SOUTLAT$_X$ to the output circuit 107 when the latchable period signal TLAT has transitioned from high level to low level. The output circuit 107 externally outputs a signal from the non-volatile memory 10 according to the logic value SOUTLAT$_X$ ("1" or "0") input from the latching circuit 106.

Hence, according to the non-volatile memory 10 of the first exemplary embodiment, the access period TAC can be made shorter than in the case when conversion to logic values is performed without previously making the voltage of the wiring line 65 a voltage of equivalent magnitude to the magnitude of the reference voltage VREF (the constant voltage VREFEQ), before the difference voltage is converted into a logic value. This is achieved because the data reading period TREAD can be shortened from when the voltage of the word line WL$_y$ reaches the voltage VCW until completion of logic value conversion.

When charging with the charging circuit 114 is initiated, point A in FIG. 4, capacitance coupling occurs in the difference voltage output circuit 116B due to the gate capacitance of the PMOS transistor 60C and the NMOS transistors 62A, 62C of the serial circuit 58. This results in the gate voltages of the PMOS transistor 60C and the NMOS transistors 62A, 62C, which is the reference voltage VREF, spiking up.

However, in the non-volatile memory 10 according to the first exemplary embodiment the coupling compensation circuit 34 is employed to compensate for this occurring with a charge of opposite polarity to the coupling charge arising from this capacitance coupling, generated at the gate terminals of the PMOS transistor 60C and the NMOS transistors 62A, 62C.

Namely, the inverting circuit 70 of the coupling compensation circuit 34 applies the constant voltage VREFEQ to the source terminal and drain terminal of the NMOS transistor 68 when the operation period signal TAMP is at low level (when reading of data stored in the memory cell 102 is not being performed). When the operation period signal TAMP has transitioned from low level to high level, a ground level voltage is applied to the source terminal and drain terminal of the NMOS transistor 68 during the period of time when the operation period signal TAMP is high level (the period of time when reading out of data stored in the memory cell 102 is performed), and charge of equivalent amount but opposite polarity to the coupling charge being generated at the gate terminals of the PMOS transistor 60C and the NMOS transistors 62A, 62C at the current point in time is generated at the gate terminal of the NMOS transistor 68. The coupling charge of the PMOS transistor 60C and the NMOS transistors 62A, 62C is hence cancelled out by the opposite polarity charge. In other words, the capacitance coupling in the PMOS transistor 60C and the NMOS transistors 62A, 62C that occurs when charging with the charging circuit 114 is initiated is cancelled out by capacitance coupling in the NMOS transistor 68 of the coupling compensation circuit 34. The gate voltages of the PMOS transistor 60C and the NMOS transistors 62A, 62C can hence be made to be the reference voltage VREF at the point in time when charging is completed.

As explained in detail above, in the non-volatile memory 10 according to the first exemplary embodiment, when the memory cell 102 is connected and discrimination of the logic value representing the data of a memory cell 102 is performed with the logic circuit 118, by comparing the magnitude of voltage of the bit line BL that has been applied with a voltage according to the data stored in the memory cell 102 with the magnitude of the voltage reference voltage VREF of the reference voltage line 40, the time required until a comparison result is confirmed is shortened, as measured from the point in time at which the comparison of the magnitude of the voltage of the bit line BL to the magnitude of the reference voltage VREF of the reference voltage line 40 is initiated, by: precharging the bit line BL to the reference voltage VREF with the charging circuit 114, prior to making the comparison of the magnitude of the voltage of the bit line BL to the magnitude of the reference voltage VREF of the reference voltage line 40; using the serial circuit 58 to generate a difference voltage according to the difference between the magnitude of the reference voltage VREF and the magnitude of the voltage of the bit line BL with the difference voltage output circuit 116B; and using the coupling compensation circuit 34 to absorb the coupling charge generated in the PMOS transistor 60C and the NMOS transistors 62A, 62C so as to suppress the gate voltage of the PMOS transistor 60C and the NMOS transistors 62A, 62C of the serial circuit 58 from rising as charging is initiated. Consequently, an access delay can be suppressed from occurring.

In the non-volatile memory 10 according to the first exemplary embodiment, charge of opposite polarity and equivalent amount to the coupling charge generated in the PMOS transistor 60C and the NMOS transistors 62A, 62C is generated by the coupling compensation circuit 34, and this generated charge is employed to absorb the coupling charge. Accordingly the gate voltages of the PMOS transistor 60C and the NMOS transistors 62A, 62C can be readily suppressed from rising.

In the non-volatile memory 10 according to the first exemplary embodiment, by configuring the coupling compensation circuit 34 to include the NMOS transistor 68 and the inverting circuit 70, the gate voltages of the PMOS transistor 60C and the NMOS transistors 62A, 62C can be suppressed from rising with a simple structure.

Furthermore, in the non-volatile memory 10 according to the first exemplary embodiment, due to configuring the serial circuit 58 with plural field effect transistors connected together in series, the generation location and coupling charge amount of the capacitance coupling can be readily estimated, enabling a reduction in the effort required for designing the coupling compensation circuit 34.

Second Exemplary Embodiment

The non-volatile memory according to a second exemplary embodiment differs from the non-volatile memory 10 according to the first exemplary embodiment in that an amplifier 80 is applied in place of the amplifier 15. The same reference numerals are accordingly applied to similar configuration elements to those of the non-volatile memory 10 of the first exemplary embodiment, and further explanation thereof is omitted. Explanation follows regarding points that differ from the non-volatile memory 10 according to the first exemplary embodiment.

Figure 5:
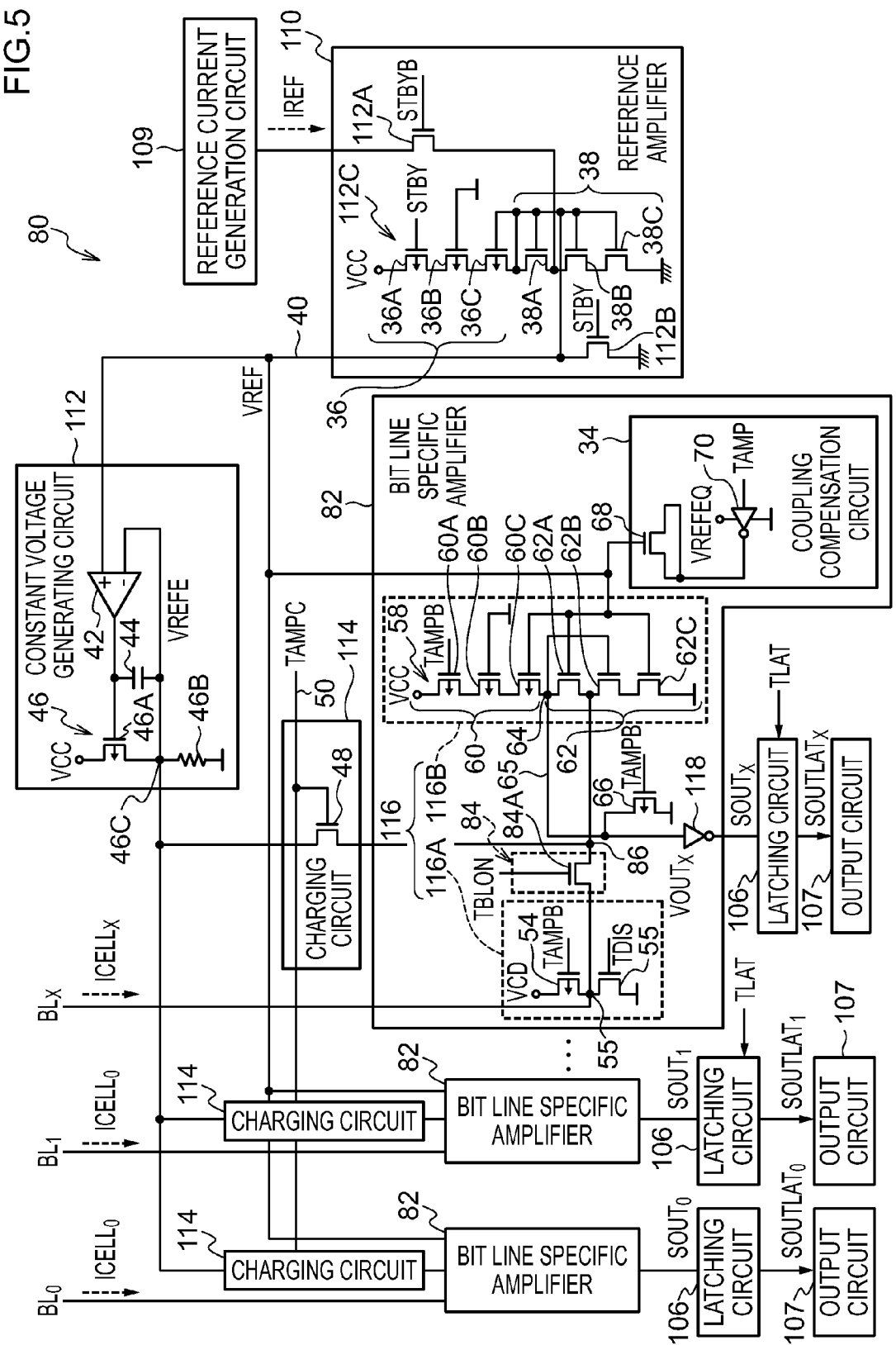
FIG. 5 is a configuration diagram illustrating an example of relevant portions of an amplifier according to a second exemplary embodiment.

FIG. 5 is a diagram illustrating an example of a configuration of the amplifier 80 according to the second exemplary embodiment. As shown in FIG. 5, the amplifier 80 differs from the amplifier 15 illustrated in FIG. 3 in that a bit line specific amplifier 82 is applied in place of the bit line specific amplifier 32. The bit line specific amplifier 82 differs from the bit line specific amplifier 32 illustrated in FIG. 3 in that instead of the bit line BL being connected to the source terminal of the NMOS transistor 48 in the charging circuit 114, the bit line BL is connected to the connection point 55 in the initialization execution circuit 116A between the drain terminal of the PMOS transistor 54 and the drain terminal of the NMOS transistor 56. A new isolation circuit 84 is also provided.

The isolation circuit 84 is a circuit for electrically isolating the initialization execution circuit 116A from the difference voltage output circuit 116B, the charging circuit 114 and the constant voltage generating circuit 112, at a specific timing and for a specific duration. The isolation circuit 84 is equipped with an NMOS transistor 84A. The NMOS transistor 84A is inserted on the bit line BL between a charge point 86 that is the connection point to the NMOS transistor 48 and a connection point 55. Namely, the source terminal of the NMOS transistor 84A is connected to the connection point 55 through the bit line BL, and the drain terminal of the NMOS transistor 84A is connected to the charge point 86 through the bit line BL. The connection point between the source terminal of the NMOS transistor 62A and the drain terminal of the NMOS transistor 62B is connected to the charge point 86 through the bit line BL. The timing signal generation circuit 30 is also connected to the gate terminal of the NMOS transistor 84A so as to input a signal TBLON expressed at high level in a period to induce a conducting state between the source terminal and the drain terminal of the NMOS transistor 84A.

Figure 6:
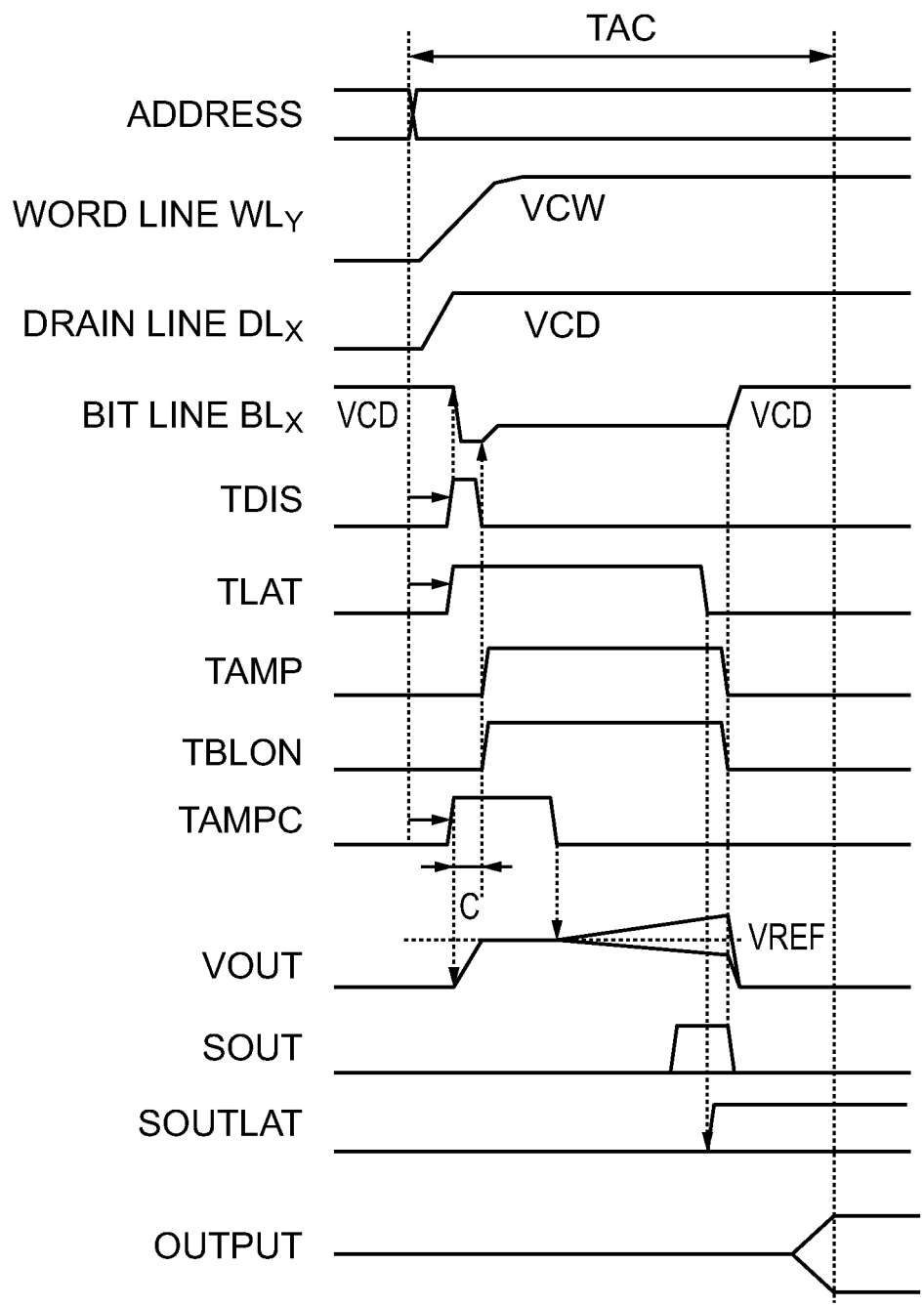
FIG. 6 is a timing chart illustrating signal transition states in a non-volatile memory according to the second exemplary embodiment.

In the thus configured amplifier 80, as shown in an example of FIG. 6, during the period of time when the operation period signal TAMP is at low level (when reading out of data in the memory cell 102 is not being performed) the signal TBLON is also made low level such that a current path between the charge point 86 and the connection point 55 is interrupted by the non-conducting state between the source terminal and the drain terminal of the NMOS transistor 84A. However, during the period of time when the operation period signal TAMP is at high level (when reading out of data in the memory cell 102 is performed) the signal TBLON is also made high level such that there is continuity in the current path between the charge point 86 and the connection point 55 due to the conducting state between the source terminal and the drain terminal of the NMOS transistor 84A.

Accordingly, in the initial period of the high level period of the charging period signal TAMPC, namely the period during which the bit line BL is being discharged (the period C illustrated in FIG. 6), due to the discontinuity in the current path between the charge point 86 and the connection point 55, a situation in which current output from the constant voltage generating circuit 112 during this period flows through the NMOS transistor 56 to outside can be prevented from occurring, and the discharge period for dropping the magnitude of the voltage of the bit line BL to a specific magnitude can also be shortened.

After discharge of the bit line BL has been completed, similarly to in the amplifier 15 according to the first exemplary embodiment, the current flowing in the bit line BL can be fed to the difference voltage output circuit 116B. Further, since current has not flowed outside through the NMOS transistor 56 during the discharge period of the bit line BL, the charging period can be shortened by an equivalent amount, and the access period TAC is accordingly shortened.

When application is not made of the amplifier 80 according to the second exemplary embodiment, a constant voltage generating circuit 112 needs to be applied that has a voltage supply capability able to make up for the amount of current that has flowed outside. However, in the amplifier 80 according to the second exemplary embodiment outflow of current during discharge is prevented, enabling the voltage supply capability of the constant voltage generating circuit 112 to be reduced by the amount of current that was prevented from flowing out in discharging.

In each of the above exemplary embodiments, the NMOS transistor 68 is employed as a configuration element of the coupling compensation circuit 34, however there is no limitation thereto. For example, configuration may be made with a PMOS transistor. Configuration may be made with a capacitance element employed such as a condenser or capacitance diode. Any capacitance element may be applied that is similarly capable of generating a coupling charge of opposite polarity to enable the coupling charge generated in the serial circuit 58 to be absorbed. Configuration may also be made such that coupling charge generated in the serial circuit 58 is absorbed by generating coupling charge of opposite polarity using a circuit configured by a serial circuit of such capacitance elements connected together in series, a parallel circuit of such capacitance elements connected together in parallel, or a combination of serial and parallel circuits.

Furthermore, whereas in each of the above exemplary embodiments examples explained have applied the serial circuit 58 configured with plural field effect transistors connected together in series to serve as a capacitance load for generating coupling charge, there is no limitation thereto. Configuration may be made employing, for example, a voltage-dividing circuit configured with a combination of capacitance loads such as capacitance elements of condensers or capacitance diodes in the serial circuit 58, or a voltage-dividing circuit configured by a combination of capacitance elements other than field effect transistors so as to generate the difference voltage VOUT. Accordingly, any circuit may be employed with capability to function as a capacitance load for generating capacitance coupling, and capable of generating voltage corresponding to the difference between the magnitude of the current ICELL and the magnitude of the reference current IREF for supplying to the logic circuit 118.

While explanation has been given in the second exemplary embodiment of a case in which the isolation circuit 84 includes the NMOS transistor 84A, configuration may be made with application of a PMOS transistor in place of the NMOS transistor 84A. Configuration may also be made with a circuit in which transistors are connected together in serial or parallel in place of the isolation circuit 84. In any of these cases a signal needs to be input to the gate terminals of a transistor such that switching can be made between a conducting state and a non-conducting state on a current path between the charge point 86 and the connection point 55, as explained in the above second exemplary embodiment.

What is claimed is:

1. A non-volatile storage device comprising:
    a bit line that is connected to a non-volatile storage element for storing an electrically re-writable logic value, the bit line having a voltage with a magnitude corresponding to the logic value stored in the storage element;
    a charging section that, when discriminating the logic value by performing a comparison of the magnitude of the voltage applied to the bit line to the magnitude of a reference voltage applied to a reference voltage line, charges the bit line to a voltage of equivalent magnitude to the reference voltage prior to performing the comparison;
    a voltage generation section that is connected between the reference voltage line and the bit line, the voltage generation section comprising a capacitance load for generating coupling charge when charging by the charging section has been performed, and employing the capacitance load to generate a voltage according to a difference between the magnitude of the voltage of the reference voltage line and the magnitude of the voltage of the bit line as a voltage expressing the comparison result; and a charge absorbing section for absorbing the coupling charge generated by the capacitance load.

2. The non-volatile storage device of claim 1, wherein the charge absorbing section generates charge of the opposite polarity and of substantially the same amount as the coupling charge, and employs the generated charge to absorb the coupling charge.

3. The non-volatile storage device of claim 1, wherein the charge absorbing section comprises:

a field effect transistor having a source terminal, a drain terminal, and a gate terminal that is connected to a connection point between the reference voltage line and the capacitance load; and a voltage application section that applies ground voltage to the source terminal and the drain terminal of the field effect transistor during a reading out period from starting untill completing reading out the logic value from the storage element, and applies a voltage to the source terminal and the drain terminal of the field effect transistor of equivalent magnitude to the reference voltage magnitude during periods other than the reading out period.

4. The non-volatile storage device of claim 1, wherein the capacitance load is configured by a serial circuit configured with a plurality of field effect transistors connected together in series.

5. The non-volatile storage device, comprising:

a bit line that is connected to a non-volatile storage element for storing an electrically re-writable logic value, the bit line having a voltage with a magnitude corresponding to the logic value stored in the storage element;

a discharge section that is connected to the bit line and that operates so as to discharge the bit line during an initial period of a charging period for charging the bit line;

a switching section that is connected to the discharge section, and switches between a non-conducting state and a conducting state, such that a current path between a charging node and the discharge section is in a non-conducting state during the initial period and the current path is in a conducting state during periods of the charging period other than the initial period, a charging section that, when discriminating the logic value by performing a comparison of the magnitude of the voltage applied to the bit line to the magnitude of a reference voltage applied to a reference voltage line, supplies to the charging node a voltage of equivalent magnitude to the reference voltage prior to performing the comparison;

a voltage generation section that is connected between the reference voltage line and the bit line, the voltage generation section comprising a capacitance load for generating coupling charge when charging by the charging section has been performed, and employing the capacitance load to generate a voltage according to a difference between the magnitude of the voltage of the reference voltage line and the magnitude of the voltage of the bit line as a voltage expressing the comparison result; and a charge absorbing section for absorbing the coupling charge generated by the capacitance load.

6. The non-volatile storage device of claim 5, wherein:

the switching section comprises a field effect transistor; and the switching section switches the current path between a non-conducting state and a conducting state by switching the state between the source terminal and the drain terminal of the field effect transistor to a conducting state or a non-conducting state.

* * * * *